(12) United States Patent
Wong et al.

(10) Patent No.: US 9,231,589 B2
(45) Date of Patent: Jan. 5, 2016

(54) SLEW RATE CONTROL FOR MULTIPLE VOLTAGE DOMAINS

(71) Applicant: NXP B.V., Eindhoven (NL)

(72) Inventors: Hok-tung Wong, Maricopa, AZ (US); Yang Zhao, Tempe, AZ (US); Brad Gunter, Tempe, AZ (US); Alma Anderson, Chandler, AZ (US); James Caravella, Chandler, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/103,559

(22) Filed: Dec. 11, 2013

(65) Prior Publication Data

US 2014/0347111 A1 Nov. 27, 2014

Related U.S. Application Data

(60) Provisional application No. 61/825,610, filed on May 21, 2013.

(51) Int. Cl.
*H03K 5/12* (2006.01)
*H03K 19/00* (2006.01)
*H03K 19/017* (2006.01)
*H03K 19/0185* (2006.01)

(52) U.S. Cl.
CPC .......... *H03K 19/00* (2013.01); *H03K 19/01714* (2013.01); *H03K 19/018507* (2013.01); *H03K 19/018585* (2013.01)

(58) Field of Classification Search
USPC ............ 326/62, 63, 68, 80, 81; 327/333, 165, 327/166, 170, 172, 176; 365/189.11
See application file for complete search history.

(56) References Cited

U.S. PATENT DOCUMENTS

| | | | |
|---|---|---|---|
| 6,281,730 B1 * | 8/2001 | Vu | 327/170 |
| 6,914,457 B2 * | 7/2005 | Confalonieri et al. | 327/108 |
| 7,696,808 B2 * | 4/2010 | Wong et al. | 327/384 |
| 7,889,003 B2 * | 2/2011 | Basten | 330/251 |
| 2005/0218988 A1 * | 10/2005 | Berkhout | 330/269 |
| 2006/0012411 A1 * | 1/2006 | De Langen | 327/170 |
| 2010/0052735 A1 * | 3/2010 | Burkland et al. | 327/66 |

* cited by examiner

*Primary Examiner* — Brandon S Cole (57) ABSTRACT

A reference output device includes a low side selector configured to select a first voltage level as an output signal. The output signal is a reference voltage. The reference output device also includes a high side selector configured to select a second voltage level as the output signal. The reference output device also includes a slew rate control configured to switch the output signal between the first voltage level and the second voltage level at a constant slew rate.

15 Claims, 5 Drawing Sheets

SLEW RATE CONTROL FOR MULTIPLE VOLTAGE DOMAINS

This application is entitled to the benefit of provisional U.S. Patent Application Ser. No. 61/825,610, filed May 21, 2013, the disclosure of which is incorporated by reference herein in its entirety.

A slew rate is the rate of change of a signal that transitions between voltage levels. Non-linear slew rates may generate the electromagnetic field (EMF) radiation affecting nearby circuits or devices, which may adversely affect the operation of the circuits or devices. Linear, or constant, slew rates generate much less EMF radiation, and therefore may be preferable for certain applications, specifically in integrated circuits where a large number of components are contained within a small area.

Embodiments of a device, a circuit, and a method are disclosed. In one embodiment, the device is a reference output device. The device includes a low side selector configured to select a first voltage level as an output signal. The output signal is a reference voltage. The reference output device also includes a high side selector configured to select a second voltage level as the output signal. The reference output device also includes a slew rate control configured to switch the output signal between the first voltage level and the second voltage level at a constant slew rate.

In one embodiment, the system is a reference output circuit. The circuit includes a first transistor connecting a first voltage signal to an output signal. The output signal is a reference voltage. A second transistor connecting a second voltage signal to the output signal. A slew rate control configured to switch the output signal between the first voltage level and the second voltage level at a constant slew rate.

In one embodiment, the method is a method a constant slew rate. The method includes selecting a first voltage level using a first transistor. A first capacitor connects a gate of the first transistor to a drain of the first transistor. The method also includes selecting a second voltage level using a second transistor as the output signal. A second capacitor connects a gate of the second transistor to a drain of the second transistor. The method also includes switching an output signal between the first voltage level and the second voltage level. The output signal is a reference voltage. The method also includes maintaining a constant slew rate when switching the output signal between the first voltage level and the second voltage level. Other embodiments of the device, circuit, and method are also described.

Other aspects in accordance with the invention will become apparent from the following detailed description, taken in conjunction with the accompanying drawings, illustrated by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

While many embodiments are described herein, at least some of the described embodiments present a device and method for slew rate control for a reference output in multiple voltage (or power) domains. Specifically, the slew rate control provides a well controlled, linear slew rate when switching the reference voltage output between at least two different voltage domains. The slew rate is also independent of load and power supply conditions, such that the linear slew rate may be maintained in spite of changes to the load conditions or supply voltages. In various embodiments, the input to the device may operate in the same voltage domain as the output or in a different voltage domain, depending on the input into the device and the output selected by the device. The rise time and the fall time of the transitions may be programmed separately without affecting each other. The device is also capable of having low output impedance with low current consumption. Additionally, the device is able to operate on a wide range of power supply voltages. The device may also be configured to prevent shoot-through current when transitioning between the high voltage and the low voltage.

Figure 1:
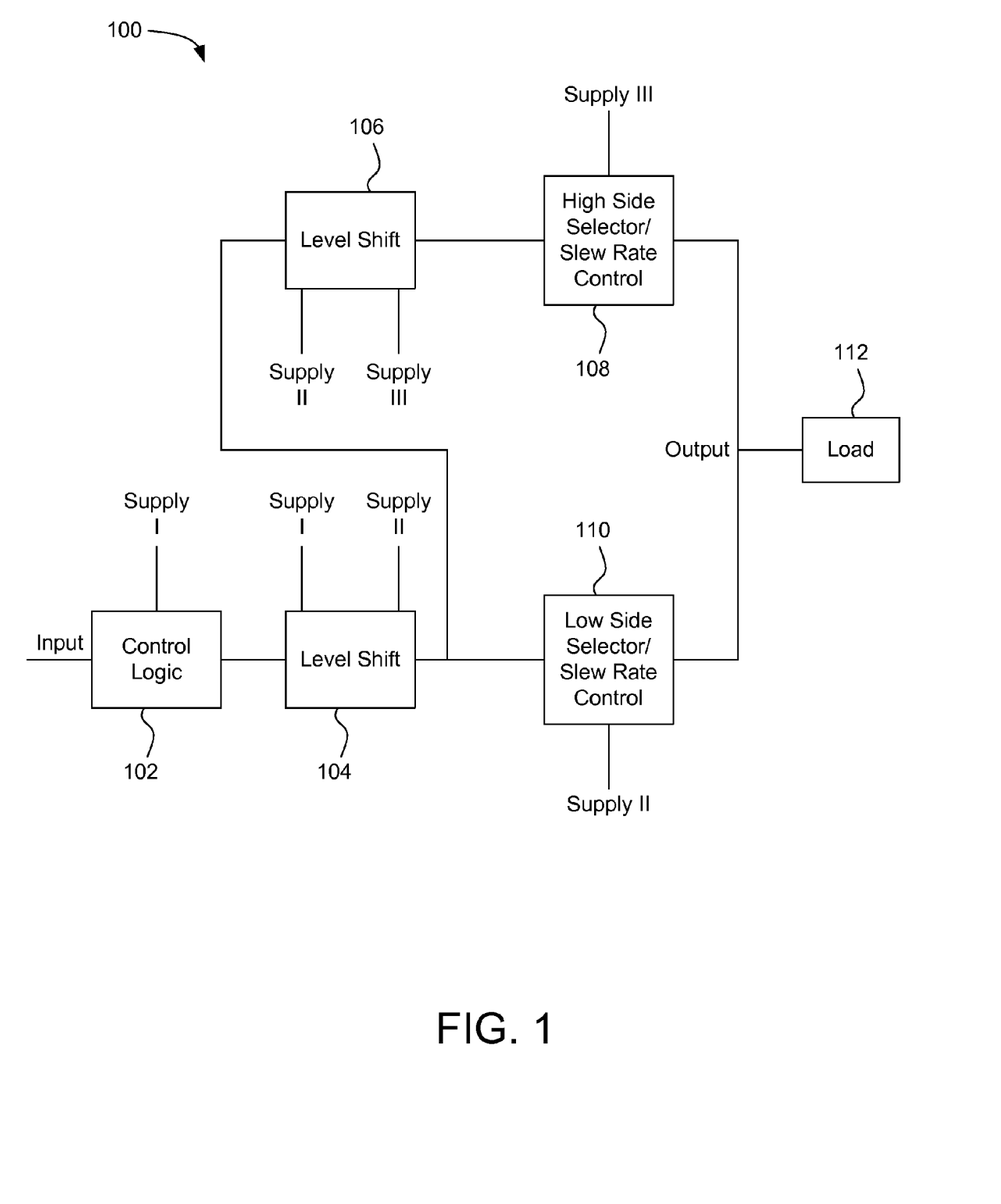
FIG. 1 depicts a block diagram of one embodiment of a reference output device operating in multiple voltage domains.

FIG. 1 depicts a block diagram of one embodiment of a reference output device 100 operating in multiple voltage domains. While the reference output device 100 is described as having the components shown in FIG. 1, the reference output device 100 may have additional components or different components than those shown in FIG. 1.

In one embodiment, the reference output device 100 includes control logic 102, one or more level shifts 104, 106, a high side selector 108, and a low side selector 110. As shown, the high side selector 108 and the low side selector 110 each have their own corresponding slew rate control (shown as part of the selectors) for controlling the slew rate when transitioning from a low voltage level to a high voltage level and from the high voltage level to the low voltage level, which is described in more detail in FIG. 3.

The output of the reference output device 100 is connected to a load 112. The load 112 may be any type of circuit capable of operating in multiple voltage domains. The output of the reference output device 100 is used as the reference voltage for the load 112. The load circuit may perform different operations in the different voltage domains or a single operation that has a different output in the different voltage domains. Alternatively, the load circuit may be configured to perform multiple operations in each voltage domain.

The control logic 102 may be any logic configured to receive and/or decode an input signal. The input signal may be one of a plurality of input signals. In one embodiment, the reference output device 100 includes two level shifts. The level shifts may alter the input signal decoded by the control logic 102 in at least one of two ways.

A first level shift 104 may adjust a voltage swing of the input signal. The input signal may oscillate between two voltage levels. The input signal decoded by the control logic 102 may have a specific voltage swing, and the first level shift 104 may alter the input signal to have a second voltage swing. For example, the input signal may have a voltage swing between 0 volts (V) and 1.8V. The first level shift 104 may adjust the swing of the input voltage to a new voltage swing, for example, 0V-3V. The first level shift 104 may also receive as inputs supply voltage sources with voltage values of 1.8V and 3V (Supply I and Supply II, respectively).

In other embodiments, the input signal may have a different voltage swing, and the first level shift 104 may adjust the voltage swing to a voltage swing other than described herein, depending on the specifications and requirements of the input and the load 112. The first level shift 104 may produce an output that is input into the low side selector 110. The low side selector 104 may also receive a supply voltage (Supply II) as an input. In one embodiment, the output from the first level shift 104 is in the same voltage domain as the input signal, but with a different voltage swing.

In one embodiment, a second level shift 106 is connected to the output of the first level shift 104. The second level shift 106 receives the signal having the altered voltage swing as an input. The second level shift 106 may be configured to adjust the input voltage signal to a new voltage domain. For example, the second level shift 106 may adjust the signal with a 0V-3V swing, as described in conjunction with the first level shift 104, to a new voltage domain with a 3V swing from 13V-16V. The second level shift 106 may also receive as inputs supply voltage sources with voltage values of 3V and 16V (Supply II and Supply III, respectively).

In other embodiments, the output of the second level shift 106 may be at any voltage domain. The output of the second level shift 106 is input into the high side selector 108. The high side selector 108 may also receive a supply voltage (Supply III) as an input. Because the output of the second level shift 106 is in a different voltage domain than the output of the first level shift 104, the high side selector 108 and the low side selector 110 receive inputs in different voltage domains, allowing the reference output device 100 to output a signal in different voltage domains depending on which selector is active. The supply voltages input into each of the voltage selectors may also be different than shown.

Figure 2:
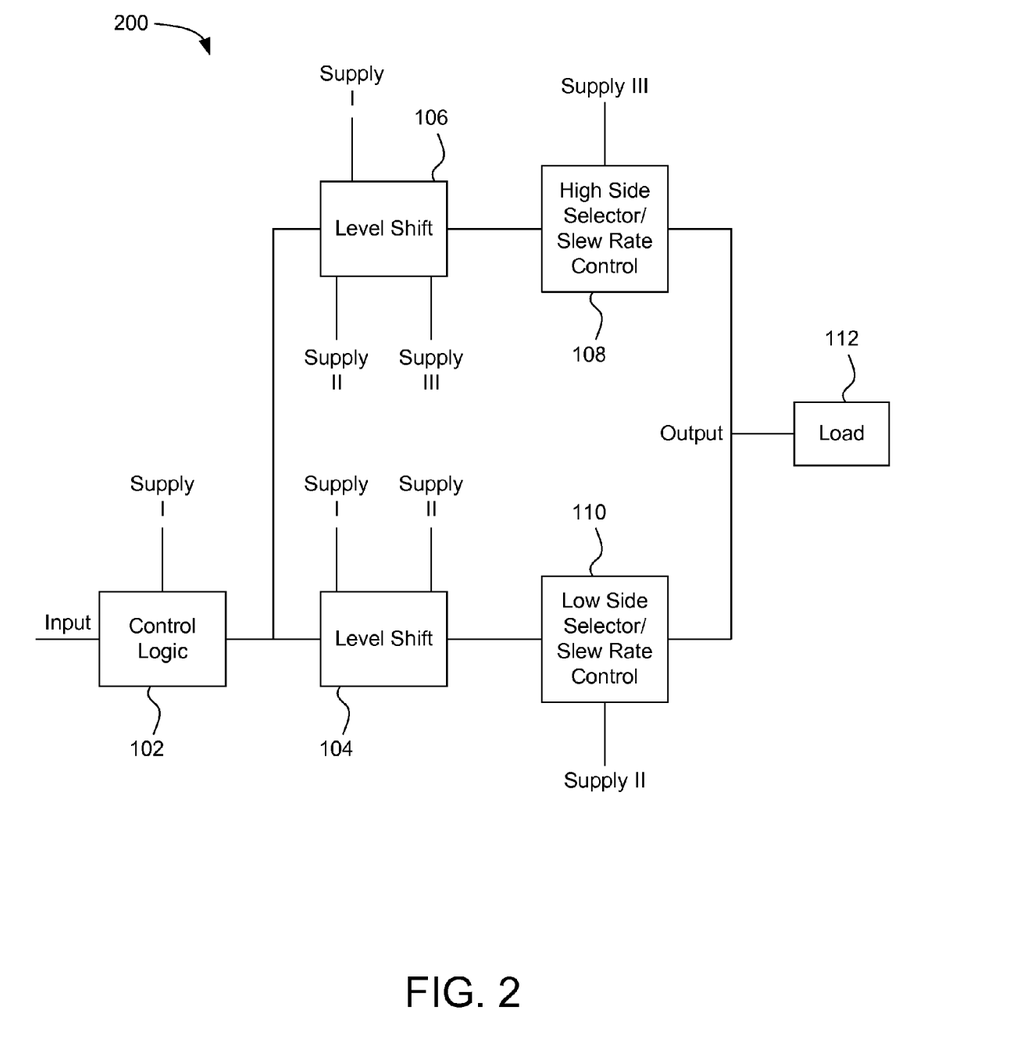
FIG. 2 depicts a block diagram of another embodiment of a reference output device operating in multiple voltage domains.

FIG. 2 a block diagram of another embodiment of a reference output device 200 operating in multiple voltage domains. The reference output device 200 may be configured to have a different number or different configuration of level shifts than the embodiment of FIG. 1.

In one embodiment, the reference output device 200 has at least two level shifts. The first level shift 104 may receive the output of the control logic 102 and adjust a voltage swing of the input signal. The input signal may oscillate between two voltage levels. The input signal decoded by the control logic 102 may have a specific voltage swing, and the first level shift 104 may alter the input signal to have a second voltage swing. For example, the input signal may have a voltage swing between 0 volts (V) and 1.8V. The first level shift 104 may adjust the swing of the input voltage to a new voltage swing, for example, 0V-3V. The first level shift 104 may also receive as inputs supply voltage sources with voltage values of 1.8V and 3V (Supply I and Supply II, respectively). In other embodiments, the input signal may have a different voltage swing, and the first level shift 104 may adjust the voltage swing to a voltage swing other than described herein, depending on the specifications and requirements of the input and the load 112. The first level shift 104 may produce an output that is input into the low side selector 110. In one embodiment, the output from the first level shift 104 is in the same voltage domain as the input signal, but with a different voltage swing.

In one embodiment, the second level shift 106 also receives the output of the control logic 102 and adjusts the voltage swing of the input signal. The second level shift 106 is also configured to adjust the input voltage signal to a new voltage domain. For example, the second level shift 106 may first adjust the signal with a 0V-1.8V swing to a new voltage swing, for example 0V-3V, and also adjust the signal to a new voltage domain with a 3V swing from 13V-16V. In this embodiment, the second level shift 106 receives as inputs supply voltage sources with voltage values of 1.8V, 3V, and 16V (Supply I, Supply II, and Supply III, respectively). In other embodiments, the input signal may have a different voltage swing, and the second level shift 106 may adjust the voltage swing and voltage domain to a voltage swing and voltage domain other than described herein, depending on the specifications and requirements of the input and the load 112. Other configurations may include more than one level shift for the high side selector 108—a level shift for changing the voltage swing and a level shift for changing the voltage domain. The voltage swing for the high side selector 108 may be different than the voltage swing for the low side selector 110.

Figure 3:
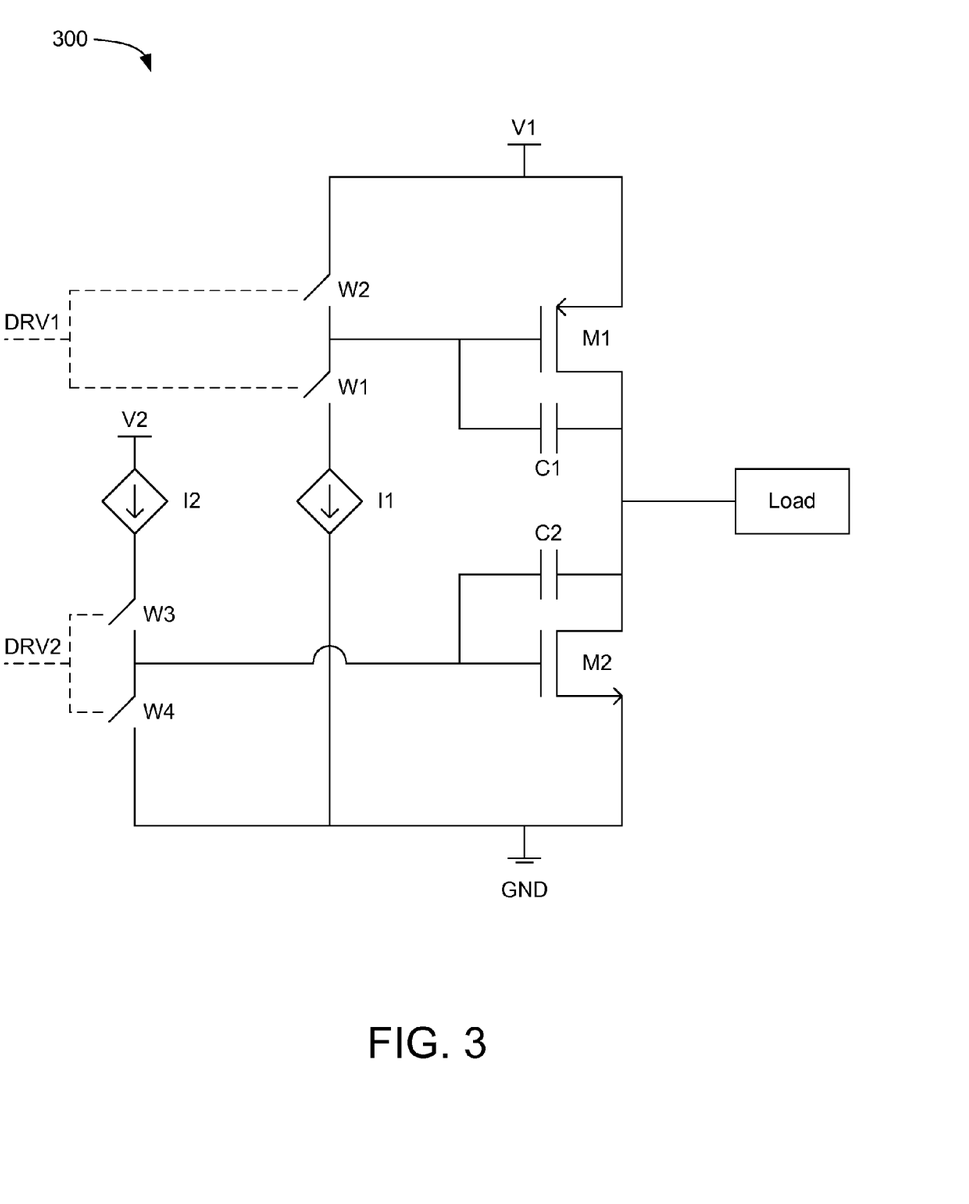
FIG. 3 depicts a schematic diagram of one embodiment of a reference output circuit.

FIG. 3 depicts a schematic diagram of one embodiment of a reference output circuit 300. The reference output circuit 300 includes voltage selectors and slew rate controls. While the voltage selectors and slew rate controls are described in conjunction with the reference output device 100 of FIG. 1, the voltage selector and slew rate control may be used in conjunction with other types of reference output devices or circuits.

In one embodiment, the voltage selectors include both the high side selector 108 and the low side selector 110. The slew rate controls include both slew rate controls for the high side selector 108 and the low side selector 110 of FIG. 1. The circuit 300 also includes a plurality of switches for activating the corresponding selectors and slew rate controls. The circuit 300 also includes current sources for providing current for operation of the selectors and slew rate controls.

The high side selector 108 is configured to select a high voltage level for the output to the load 112, and the low side selector 110 is configured to select a low voltage level for the output to the load 112. In one embodiment, the high side selector 108 includes a first transistor that connects the output and a supply voltage. The supply voltage may be any voltage. For example, the supply voltage may be 16V. When the first transistor is turned on, such that the first transistor is conducting current between the source and the drain of the first transistor, the output signal to the load 112 is 16V or approximately 16V.

Similarly, the low side selector 110 includes a second transistor that connects the output and a supply voltage or ground. While the embodiment of FIG. 3 describes the low side selector 110 connecting the output to ground, other embodiments may include any supply voltage with a lower voltage level than the supply voltage at the high side selector 108. This allows the output to be changed from the low voltage level associated with the low side selector 110 to the high voltage level associated with the high side selector 108, and vice versa.

The high side selector 108 and corresponding slew rate control are activated via a pair of switches, and the low side selector 110 and corresponding slew rate control are activated by a second pair of switches. In the current embodiment, the first transistor is a p-type transistor, and the second transistor is an n-type transistor. The transistors may be metal oxide semiconductor (MOS) transistors or other type of transistor. Other embodiments of circuits may include other configurations of transistors.

A switch W1 connects the gate of the first transistor M1 of the high side selector 108 to a first current source I1. Current source I1 is also connected to ground. A switch W2 connects the gate of transistor M1 to the source of transistor M1, which is also connected to a first supply voltage V1 with a 16V voltage output. Supply voltage V1 may correspond to Supply III, as shown in FIG. 1, or a voltage obtained based on or similar to Supply III. A first capacitor C1 connects the gate of transistor M1 to the drain of transistor M1. Switch W1 and switch W2 are controlled by a drive signal DRV1.

A switch W3 connects the gate of the second transistor M2 to a second current source I2. Current source I2 is also connected to a second supply voltage V2 with a 3V voltage output. Supply voltage V2 may correspond to Supply II, as shown in FIG. 1, or a voltage obtained based on or similar to Supply II. A switch W4 connects the gate of transistor M2 to the source of transistor M2, which is also connected to ground. A second capacitor C2 connects the gate of transistor M2 to the drain of transistor M2. Switch W3 and switch W4 are controlled by a drive signal DRV2.

The drive signals DRV1 and DRV2 are generated by the level shifts shown in FIG. 1. Drive signal DRV1 has a voltage swing from 13V-16V for operating in the voltage domain with the supply voltage V1 as the reference output. Drive signal DRV2 has a voltage swing from 0V-3V for operating in the voltage domain with ground as the reference output. With the current configuration, the switches are configured to operate with the selectors and slew controls in the corresponding voltage domains.

The operation of each of the high side selector 108 and the low side selector 110, with the corresponding slew rate controls, is described below. When DRV1 is high for activating the high side selector 108 and DRV2 is low for deactivating the low side selector 110:

1. When DRV1 is high (at 16V in the 13V-16V swing), switch W1 is on and switch W2 is off, while switch W3 is off and switch W4 is on. Therefore, switch W1 and switch W4 are out of phase from switch W2 and switch W3.
2. When switch W1 is on, current from current source I1 is fed into the gate of transistor M1 and capacitor C1.
3. Because the gate of a MOS transistor does not conduct current, all of the current from current source I1 goes through capacitor C1.
4. Current source I1 is a constant current source, so the current into the capacitor is also constant, resulting in a linearly increasing voltage across the capacitor defined as $dv/dt = I1/C1$.
5. Because capacitor C1 is connected between the gate and the drain of transistor M1, either the gate of transistor M1 is pulled down or the drain voltage of transistor M1 is pushed up.
6. Transistor M1 pushes the drain voltage up to maintain a relatively constant gate voltage, resulting in a linearly increasing voltage at the output to the load.
7. If the load on the output increases, transistor M1 supplies more current to keep a constant, linear slew rate at the output.
8. While DRV1 is high, switch W3 is off and switch W4 is on. When switch W4 is on, transistor M2 is off, and switch W3 prevents current source I2 from going into the gate of transistor M2 and capacitor C2, isolating the components from the circuit.

When DRV2 is high for activating the low side selector 110 and DRV1 is low for deactivating the high side selector 108:

1. When DRV2 is high (at 3V in the 0V-3V swing), switch W3 is on and switch W4 is off, while switch W1 is off and switch W2 is on.
2. When switch W3 is on, current through current source I2 is fed into the gate of transistor M2 and capacitor C2.
3. Because the gate of a MOS transistor does not conduct current, all of the current from current source I2 goes through capacitor C2.
4. Current source I2 is a constant current source, so the current into the capacitor is also constant, resulting in a linearly increasing voltage across the capacitor defined as $dv/dt = I2/C2$.
5. Because capacitor C2 is connected between the gate and the drain of transistor M2, either the gate of transistor M2 is pushed up or the drain voltage of transistor M2 is pulled down.
6. Transistor M2 pulls the drain voltage down to maintain a relatively constant gate voltage, resulting in a linearly decreasing voltage at the output to the load.
7. If the load on the output increases, transistor M2 sinks more current to keep a constant, linear slew rate at the output.
8. While DRV2 is high, switch W1 is off and switch W2 is on. When switch W2 is on, transistor M1 is off, and switch W1 prevents current source I1 from going into the gate of transistor M1 and capacitor C1, isolating the components from the circuit.

Because the circuit 300 is configured to operate in multiple voltage domains by switching between the 16V reference and the 0V reference for the output, the switches may be configured to prevent shoot-through current when switching between the high side selector 108 and the low side selector 110. For example, when activating the high side selector 108, switch W3 may be opened and switch 4 is closed slightly before switch W1 is closed and switch W2 is opened, thereby preventing current from going between ground and supply voltage V1. When activating the low side selector 110, switch W1 may be opened and switch W2 closed slightly before switch W3 is closed and switch W4 is opened, thereby preventing current from going between ground and supply voltage V1. In other embodiments, the timing of the switches may be other than described herein, depending on the components and voltages used, and the requirements of the circuit 300.

As described above, the slew rate of the circuit 300 is determined by the constant current source and the corresponding capacitor, and is not dependent on supply voltages and the loading at the output. The transistors may have a gain that allows the transistors to compensate for changes in load conditions or noise to from the supply voltages. Additionally, one or more of the transistors may have low impedance such that the internal impedance of the circuit 300 as seen at the output is low. Specifically, transistor M2 may have impedance much less than one ohm. Transistor M1 may also have similar impedance.

Because the slew rate is determined by the ratio of the current source and the corresponding capacitors, the slew rate may be changed by changing the value of the current source, the capacitor, or both the current source and the capacitor. Each of the rise times and fall times may be adjusted separately because the slew rate controls are separate for the high side selector 108 and the low side selector 110. The circuit 300 also allows for fast transitions between the lower reference output and the higher reference output. Additionally, the constant current source allows the slew rate to remain constant during transition.

Figure 4:
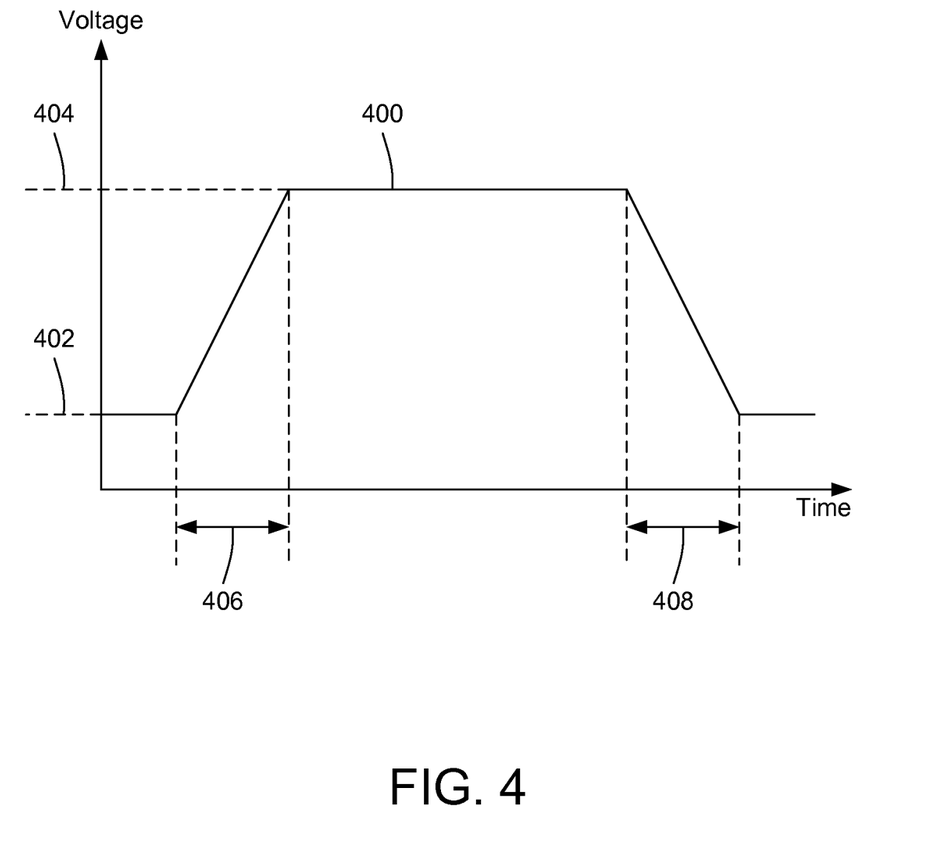
FIG. 4 depicts a graph diagram of one embodiment of an output signal 400.

FIG. 4 depicts a graph diagram of one embodiment of an output signal 400. The output signal 400 changes from a low voltage level 402 to a high voltage level 404 and then back to the low voltage level 402 after a period of time. The slew rate is the rate of change between the voltage levels. The rise time 406 of the output signal 400 is defined by the time taken to transition from the low voltage level 402 to the high voltage level 404. The fall time 408 of the output signal 400 is defined by the time taken to transition from the high voltage level 404 to the low voltage level 402. The slew rate of each of the transitions may be controlled together or separately, such that the rise time 406 and the fall time 408 may be the same or different depending on the components selected for the reference output circuit 300. Because the rise time 406 and the fall time 408 are each determined by the corresponding current sources and capacitors, the slew rate may be controlled separately for each of the transitions.

Figure 5:
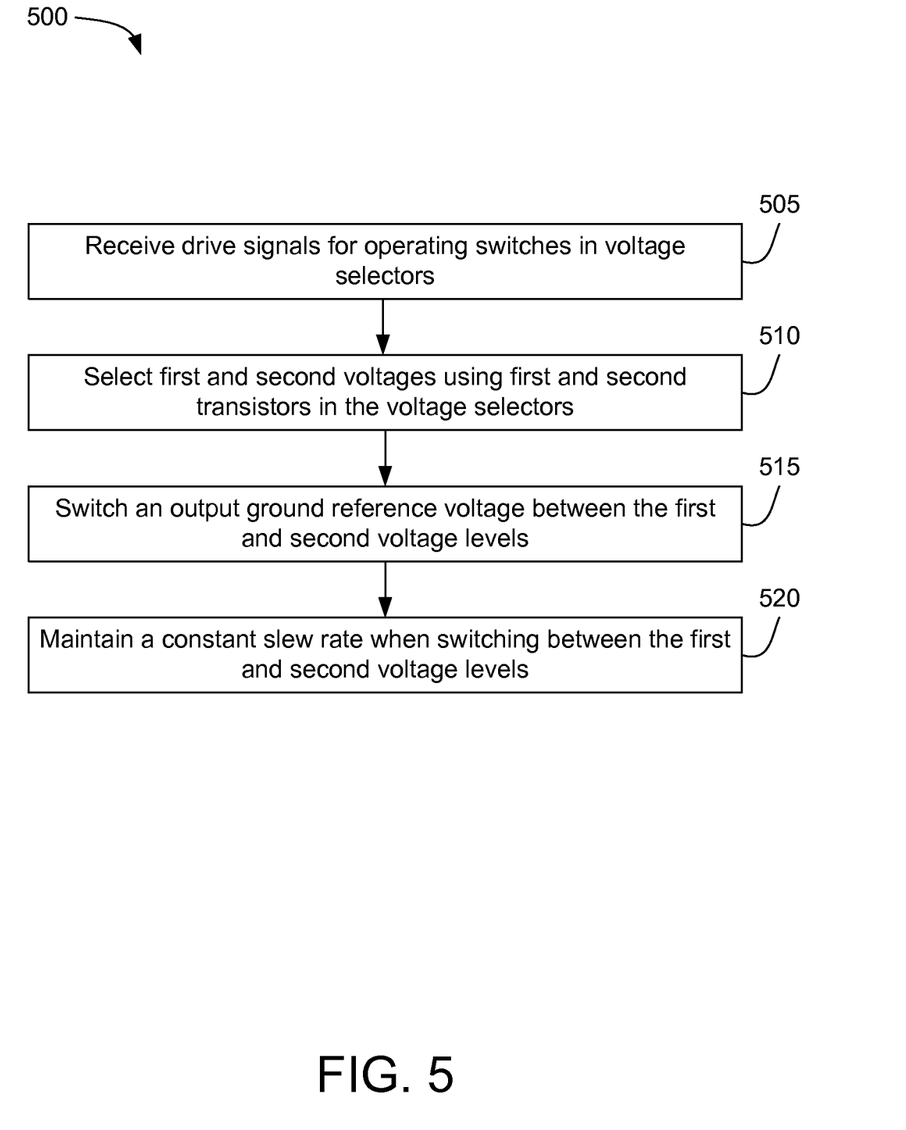
FIG. 5 depicts a flowchart diagram of one embodiment of a method of controlling a slew rate in multiple voltage domains.

FIG. 5 depicts a flowchart diagram of one embodiment of a method 500 of controlling a slew rate in multiple voltage domains. While the method 500 is described in conjunction with the reference output device 100 of FIG. 1 and the reference output circuit 300 of FIG. 3, the method 500 may be used in conjunction with any reference output device 100 that contains the voltage selectors and slew rate controls described herein.

At least one drive signal for operating switches in voltage selectors is received 505. In one embodiment, a drive signal is received for each of the voltage selectors in the reference output circuit 300. The voltage selectors may include a high side selector 108 and a low side selector 110. The drive signals may be produced by level shifts that modify the swing and/or voltage domain of an input signal. The drive signal for the high side selector 108 may operate in a different voltage domain than the drive signal for the low side selector 110.

In one embodiment, the drive signal for the high side selector 108 has a voltage swing from 13V-16V and the drive signal for the low side selector 110 has a voltage swing from 0V-3V. The switches are configured to operate based on the voltage level of each of the corresponding drive signals. For example, when the drive signal for the high side selector 108 is at 13V, a first switch for the high side selector 108 is configured to open, and a second switch is configured to close. When the drive signal for the high side selector 108 is at 16V, the previously open first switch is configured to close, and the previously closed second switch is configured to open. In this manner, the switches are synced out of phase with each other. Similarly, when the high side selector 108 is activated via the corresponding switch, the switch that turns on the low side selector 110 is open to deactivate the low side selector 110, and the other switch corresponding to the low side selector 110 is closed. Thus, the switches for the low side selector 110 are synced out of phase with the switches for the high side selector 108 to deactivate the low side selector 110 when the high side selector 108 is activated, and vice versa. The switches may be configured to open and close in an order that prevents shoot-through current between ground and voltage supplies.

In one embodiment, the switches are used to determine whether current from current sources is input into the gates of transistors in the high side selector 108 and the low side selector 110 that are used to select the output of the circuit 300. In one embodiment, first and second voltages are selected 510 as the output using a first transistor in the high side selector 108 and a second transistor in the low side selector 110. In one embodiment, the transistors are MOS transistors with low impedance, though the transistors may be any type of transistor. For example, at least one of the transistors may have impedance much less than one ohm.

The circuit 300 switches 515 the output reference voltage between the first and second voltage levels using the switches. The output reference voltage may be switched at any rate, depending on the requirements of the load 112 at the output of the circuit 300.

The circuit 300 also maintains 520 a constant (or linear) slew rate when switching between the first and second voltage levels. The slew rate is determined by a ratio of current from the current sources through corresponding capacitors connecting the gate of each transistor to the drain of the same transistor. The capacitor conducts all of the current from the current source when the corresponding transistor is selected because the transistor does not conduct the current at the gate. In one embodiment, the ratio is defined as $dv/dt=I/C$, where I is the current from the current source, and C is the capacitance of the corresponding capacitor. Thus, the slew rate may be set by picking specific values for the current source and the corresponding capacitor. Selecting a larger I/C ratio results in a faster rise/fall time, and selecting a lower I/C ratio results in a slower rise/fall time. In either scenario, the slew rate is constant.

Because the slew rate is determined by the current sources and corresponding capacitors, the slew rate is independent of the supply voltages. The gain of the transistors may also be set such that the slew rate is independent of load impedance by compensating for changes in loading conditions, for example, by changing the amount of current through the transistor.

In one embodiment, the rise time corresponding to switching the output signal from the low voltage level to the high voltage level is symmetrical to a fall time corresponding to switching the output signal from the high voltage level to the low voltage level. In another embodiment, the rise time and the fall time are set independently of each other, and the rise time is different than the fall time.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A reference power supply output device, comprising:
   a low side selector configured to select a first voltage level from a first external voltage supply as an output signal, wherein the output signal is a reference voltage;
   a high side selector configured to select a second voltage level from a second external voltage supply as the output signal; and
   a slew rate control configured to switch the output signal between the first voltage level and the second voltage level at a constant slew rate while switching between at least two different voltage domains, wherein the high side selector comprises a first transistor and the low side selector comprises a second transistor, wherein the slew rate control comprises:
   a first capacitor connecting a gate of the first transistor to a drain of the first transistor;
   a second capacitor connecting a gate of the second transistor to a drain of the second transistor;
   a first current source connected to the gate of the first transistor and the first capacitor via a first switch;
   a second current source connected to the gate of the second transistor and the second capacitor via a second switch, wherein the drain of the first transistor is connected to the drain of the second transistor;
   a third switch connected to the first switch and positioned between the gate of the first transistor and a source of the first transistor; and
   a fourth switch connected to the second switch and positioned between the gate of the second transistor and a source of the second transistor, wherein the third switch is in phase with the second switch and the fourth switch is in phase with the first switch, and wherein the third switch and the fourth switch are connected to different supply voltages.

2. The device of claim 1, wherein the slew rate is determined by a ratio of current from one of the first current source and the second current source through a corresponding one of the first capacitor and the second capacitor.

3. The device of claim 1, wherein the high side driver and the low side driver are configured to turn on the corresponding one of the first transistor and the second transistor from a non-conducting state by:
   closing the first switch and opening the third switch in response to opening the second switch and closing the fourth switch.

4. The device of claim 1, wherein the high side driver and the low side driver are configured to turn on the corresponding one of the first transistor and the second transistor from a non-conducting state by:
   closing the second switch and opening the fourth switch in response to opening the first switch and closing the third switch.

5. The device of claim 1, wherein the slew rate is independent of a load impedance based on a gain of at least one of the first transistor and the second transistor.

6. The device of claim 1, wherein an impedance of at least one of the first transistor and the second transistor is less than one ohm.

7. The device of claim 1, wherein a rise time corresponding to switching the output signal from the first voltage level to the second voltage level is symmetrical to a fall time corresponding to switching the output signal from the second voltage level to the first voltage level.

8. The device of claim 1, wherein the slew rate is independent of supply voltages.

9. A reference power supply output circuit, comprising:
   a first transistor connecting a first voltage signal to an output signal, wherein the output signal is a reference voltage;
   a second transistor connecting a second voltage signal to the output signal; and
   a slew rate control configured to switch the output signal between the first voltage level and the second voltage level at a constant slew rate while switching between at least two different voltage domains, wherein the slew rate control comprises:
   a first current source connected to a gate of the first transistor via a first switch;
   a first capacitor connecting the gate of the first transistor to a drain of the first transistor, wherein the first capacitor conducts current from the first current source when the first switch is closed;
   a second current source connected to a gate of the second transistor via a second switch;
   a second capacitor connecting the gate of the second transistor to a drain of the second transistor, wherein the second capacitor conducts current from the second current source when the second switch is closed,
   wherein the drain of the first transistor is connected to the drain of the second transistor at the output signal;
   a third switch connected to the first switch and positioned between the gate of the first transistor and a source of the first transistor; and
   a fourth switch connected to the second switch and positioned between the gate of the second transistor and a source of the second transistor, wherein the third switch is in phase with the second switch and the fourth switch is in phase with the first switch, and wherein the third switch and the fourth switch are connected to different supply voltages.

10. The circuit of claim 9, wherein the first transistor is a p-type transistor and the second transistor is an n-type transistor.

11. The circuit of claim 9, wherein at least one of the first transistor and the second transistor comprises an impedance less than one ohm.

12. The circuit of claim 9, wherein a gain of each transistor is configured to compensate for a change in load impedance at the output signal to maintain the constant slew rate.

13. A method for a constant slew rate, the method comprising:
- selecting a first voltage level using a first transistor, wherein a first capacitor connects a gate of the first transistor to a drain of the first transistor;
- selecting a second voltage level using a second transistor as the output signal, wherein a second capacitor connects a gate of the second transistor to a drain of the second transistor;
- switching an output signal between the first voltage level and the second voltage level to switch between at least two different voltage domains using a slew rate control, wherein the output signal is a reference voltage, wherein the slew rate control comprises:
- a first current source connected to the gate of the first transistor and the first capacitor via a first switch;
- a second current source connected to the gate of the second transistor and the second capacitor via a second switch, wherein the drain of the first transistor is connected to the drain of the second transistor;
- a third switch connected to the first switch and positioned between the gate of the first transistor and a source of the first transistor; and
- a fourth switch connected to the second switch and positioned between the gate of the second transistor and a source of the second transistor, wherein the third switch is in phase with the second switch and the fourth switch is in phase with the first switch, and wherein the third switch and the fourth switch are connected to different supply voltages; and
- maintaining a constant slew rate when switching the output signal between the first voltage level and the second voltage level.

14. The method of claim 13, further comprising maintaining symmetrical rise times and fall times when switching the output signal between the first voltage level and the second voltage level based on a ratio of current through a corresponding one of the first capacitor and the second capacitor.

15. The method of claim 13, further comprising maintaining the constant slew rate independently of a load impedance at the output signal based on a gain of at least one of the first transistor and the second transistor.

* * * * *